(12) United States Patent
Desclos

(10) Patent No.: US 9,819,324 B2
(45) Date of Patent: Nov. 14, 2017

(54) TUNABLE DUPLEXING CIRCUIT

(71) Applicant: Ethertronics, Inc., San Diego, CA (US)

(72) Inventor: Laurent Desclos, San Diego, CA (US)

(73) Assignee: Ethertronics, Inc., San Diego, CA (US)

( * ) Notice: Subject to any disclaimer, the term of this patent is extended or adjusted under 35 U.S.C. 154(b) by 0 days.

(21) Appl. No.: 15/182,412

(22) Filed: Jun. 14, 2016

(65) Prior Publication Data

US 2016/0294350 A1 Oct. 6, 2016

Related U.S. Application Data

(63) Continuation of application No. 14/614,351, filed on Feb. 4, 2015, now Pat. No. 9,391,582.

(60) Provisional application No. 61/935,820, filed on Feb. 4, 2014.

(51) Int. Cl.
*H03H 7/46* (2006.01)
*H03H 7/01* (2006.01)
*H03J 3/20* (2006.01)
*H03H 7/18* (2006.01)
*H03H 17/08* (2006.01)

(52) U.S. Cl.
CPC ........ *H03H 7/0161* (2013.01); *H03H 7/1741* (2013.01); *H03H 7/1758* (2013.01); *H03H 7/18* (2013.01); *H03H 7/463* (2013.01); *H03H 7/465* (2013.01); *H03J 3/20* (2013.01); *H03H 17/08* (2013.01); *H03H 2210/025* (2013.01); *H03J 2200/08* (2013.01)

(58) Field of Classification Search
CPC .. H03H 7/0161; H03H 7/1741; H03H 7/1758; H03H 7/18; H03H 7/463; H03H 7/465; H03H 17/08; H03H 2210/025; H03J 3/20; H03J 2200/08
USPC ........................................................ 333/132
See application file for complete search history.

(56) References Cited

U.S. PATENT DOCUMENTS

| | | | | |
|---|---|---|---|---|
| 4,339,829 A | * | 7/1982 | Dimon | H03J 7/02 455/182.2 |
| 7,174,147 B2 | * | 2/2007 | Toncich | H03H 7/0161 330/303 |

* cited by examiner

*Primary Examiner* — Robert Pascal
*Assistant Examiner* — Kimberly Glenn
(74) *Attorney, Agent, or Firm* — Coastal Patent Law Group, P.C.

(57) ABSTRACT

A tunable duplexer circuit is described, wherein the frequency response as well as bandwidth and transmission loss characteristics can be dynamically altered, providing improved performance for transceiver front-end applications. The rate of roll-off of the frequency response can be adjusted to improve performance when used in duplexer applications. A method is described where the duplexer circuit characteristics are optimized in conjunction with a specific antenna frequency response to provide additional out-of-band rejection in a communication system. Dynamic optimization of both the duplexer circuit and an active antenna system is described to provide improved out-of-band rejection when implemented in RF front-end circuits of communication systems. Other features and embodiments are described in the following detailed descriptions.

10 Claims, 10 Drawing Sheets

TUNABLE DUPLEXING CIRCUIT

CROSS-REFERENCE TO RELATED APPLICATIONS

This application is a continuation (CON) of U.S. Ser. No. 14/614,351, filed Feb. 4, 2015, which further claims benefit of priority with U.S. Provisional Ser. No. 61/935,820, filed Feb. 4, 2014; the contents of each of which are hereby incorporated by reference.

BACKGROUND

Field of the Invention

The invention relates generally to the field of wireless communication; and in particular, to tunable duplexers and duplexing circuits as applied to RF Front-end configurations in wireless communication systems, and dynamic adjustment of bandwidth characteristics of RF circuits using such tunable duplexers and duplexing circuits.

Background Description

As the need for higher data rates increases, communication systems are being designed to cover wider frequency bandwidths as well as a larger number of frequency bands. The introduction of 4G protocols, such as Long Term Evolution (LTE), drive the increase in additional frequency bands being used for cellular communication systems. The complexity of the RF front-end topology of communication systems is increasing due to the need for backward compatibility with 2G and 3G protocols as 4G LTE capability is introduced. In addition, LTE-Advanced as a protocol is configured to accommodate carrier aggregation, where multiple channels can be transmitted or received-on simultaneously to increase instantaneous bandwidth. This aggregation of channels can cover up to five channels spread across multiple frequency bands. Carrier aggregation that utilizes multiple frequency bands points to a need for dynamic tuning of various components of the RF front-end to provide the flexibility needed to access various frequency pairings. All of these trends point toward a growing need for more flexibility in the RF front-end of mobile communication systems to address the combining of multiple frequency bands and modes.

Dynamic tuning of components that comprise the RF front-end of communication systems is picking up adoption in the commercial communications industry, and proper implementation of dynamic tuning methods can bring improvements to communication system performance as the number of frequency bands that can be accessed grows and the instantaneous bandwidths required increases.

Size constraints in mobile devices such as cell phones typically require a single antenna to cover multiple frequency bands. Additionally, frequency division duplex (FDD) protocols are commonly used at these multiple frequency bands to allow for both transmitter and receiver to utilize a common antenna. A typical frequency band used for communication will have a nominal 25 MHz allocated for transmitting, a 20 MHz guard band, and a 25 MHz frequency band used for receiving. The guard band is a frequency span set aside to provide frequency spectrum for the transmitted and receive signals to roll-off to minimize interference between transmitter and receiver. A duplexer is commonly used to allow for use of a single antenna by both the transmitter and receiver, while maintaining isolation between both transmitter and receiver ports. The duplexer is designed to provide the roll-off in the frequency response to produce the guard band situated between transmit and receive frequencies. Current duplexers are fixed in frequency and are not dynamically tunable. As more frequency bands are added to a communication system additional duplexers are used. The plurality of duplexers can be combined using a switch to allow for a single antenna to be used at multiple frequency bands by multiple duplexers. The requirement to design a mobile device such as a cell phone that covers multiple frequency bands and multiple modes of operation forces the system designers to develop a front-end transceiver circuit that combines several power amplifiers (PA) on the transmit side and several low noise amplifiers (LNA) on the receive chain. Typically, each PA and LNA is combined using a duplexer.

The duplexers used in current commercial communication systems have a fixed frequency response. The start and stop frequencies which establish the instantaneous bandwidth as well as the guard band are fixed. The conventional technique for implementing duplexers in a communication system is to determine the frequency bandwidth required from the duplexer along with the guard band bandwidth and the slope of the skirts (the roll-off in performance as a function of frequency) for a specific function and location within the circuit topology. A duplexer that meets the frequency response requirements is designed, manufactured, and implemented in the circuit. One main drawback is the inability to dynamically alter or tune the frequency response of the duplexer once it is implemented in a circuit. A tunable duplexer would provide the capability of dynamically adjusting the bandwidth of a transmit or receive circuit to track changes in bandwidth for LTE waveforms. LTE provides for a range of bandwidths for a data stream based upon the amount of data needed to transmit or receive and priority of the data stream in the cellular network. LTE bandwidths can vary from 1.5 MHz to 20 MHz. With carrier aggregation being implemented in LTE-Advanced (LTE-A), there is now a potential of up to five channels being aggregated to increase instantaneous bandwidth to 100 MHz. A tunable duplexer would provide the capability of matching the bandwidth of the communication system front-end to the instantaneous bandwidth of the LTE waveform.

Active antennas are becoming more prevalent in communication systems. These active antennas provide the capability of dynamically adjusting the impedance match of the antenna and/or the frequency response of the antenna. Examples of such active antennas are described in commonly owned patents: U.S. Pat. No. 7,830,320; U.S. Pat. No. 7,911,402; U.S. Pat. No. 8,077,116; U.S. Pat. No. 8,362,962; U.S. Pat. No. 8,648,755; and U.S. Pat. No. 8,717,241; the contents of which are hereby incorporated by reference. With the advent of 4G LTE protocols and the frequency band requirements that come with it, the active antenna that can be dynamically tuned provides an ability to cover a wider frequency range from that of a small form factor antenna by dynamically tuning the antenna to re-tune for an intended frequency band. With the capability of changing the frequency response of an active antenna there is a potential of providing better frequency management from the entire RF front-end of a communication device, such as a cell phone, by implementing a tunable duplexer and tuning both the duplexer and active antenna con-currently as a system.

The embodiments disclosed herein address the aforementioned problems and provide a unique method of tuning a duplexer to provide dynamic adjustment of the frequency of operation and bandwidth.

SUMMARY

A tunable duplexer circuit is described, wherein the frequency response as well as bandwidth and transmission loss characteristics can be dynamically altered, providing improved performance for transceiver front-end applications. The rate of roll-off of the frequency response can be adjusted to improve performance when used in duplexer applications. A method is described where the duplexer circuit characteristics are optimized in conjunction with a specific antenna frequency response to provide additional out-of-band rejection in a communication system. Dynamic optimization of both the duplexer circuit and an active antenna system is described to provide improved out-of-band rejection when implemented in RF front-end circuits of communication systems. Other features and embodiments are described in the following detailed descriptions.

DETAILED DESCRIPTION OF THE PREFERRED EMBODIMENTS

Figure 1:
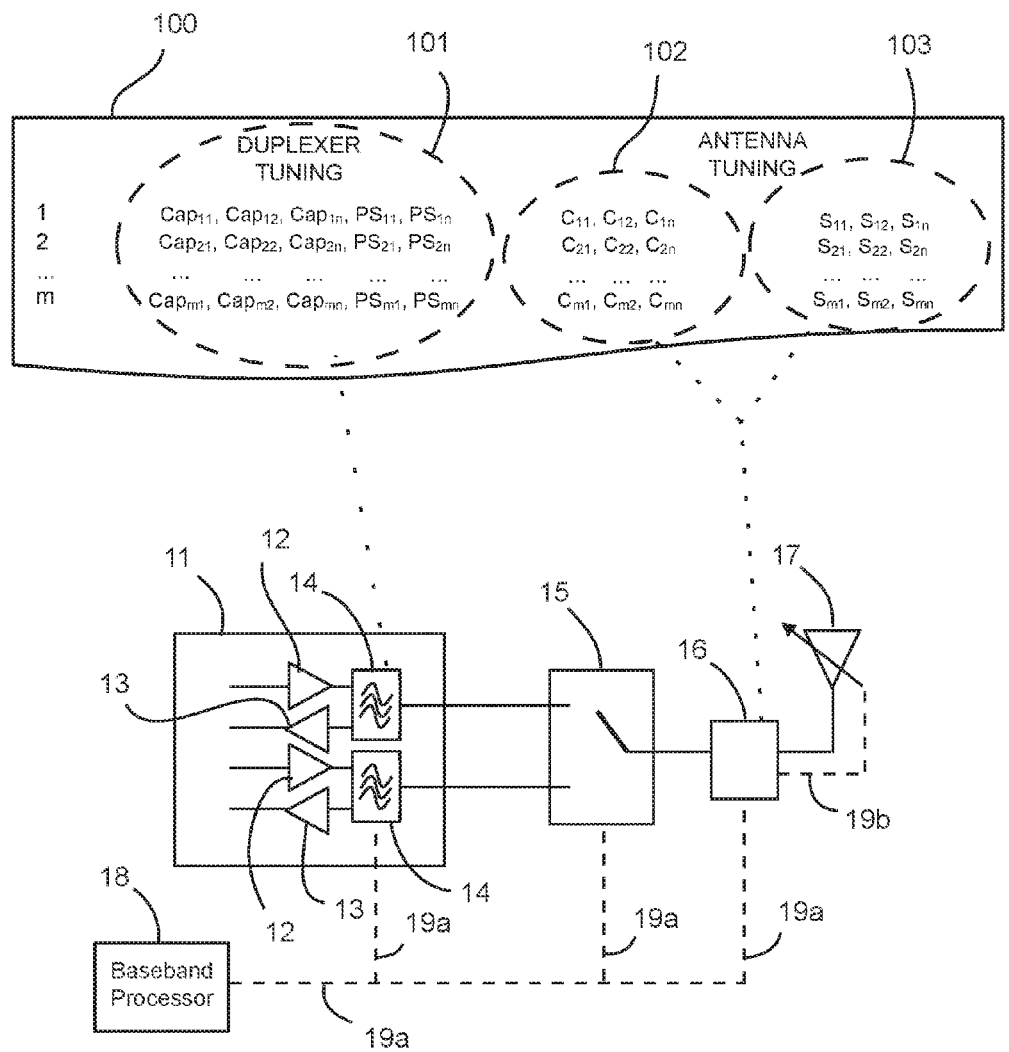
FIG. 1 illustrates a tunable duplexer combined with an active antenna system to provide the capability to dynamically adjust the frequency response of the duplexer.

A tunable duplexer circuit that can dynamically adjust the center frequency and bandwidth characteristics of both transmit and receive bands as well as the guard band characteristics, and a method for making the tunable duplexer are each disclosed. Novel circuit topologies are revealed that provide the capability to adjust the center frequency of the duplexer without affecting the bandwidth characteristics, adjust the bandwidth characteristics without affecting the center frequency, or adjust both the center frequency and bandwidth characteristics simultaneously.

One embodiment is realized in an RF circuit topology wherein three tuning circuits, or sections, are combined into one composite tuning circuit to form a tunable band-pass circuit. The tunable band pass circuit is configured to provide for dynamic altering of the frequency response of one arm of a duplexer circuit. A tunable capacitor in series with an inductor forms the first tuning section. A second tuning section includes an inductor in series with a phase shifter which is in turn in series with a tunable capacitor. A second inductor is connected in parallel to the first inductor and phase shifter. The third tuning section includes a first pair of series LC circuits (first and second LC circuits) connected in parallel, with a third series LC circuit consisting of an inductor and tunable capacitor connected at the common junction of the first pair of series LC circuits. One connection of each of the tunable capacitors is connected to ground, and the three tuning sections are connected such that they are in parallel or shunt to each other. With tunable capacitors in all three tuning sections, the resonance frequencies of the series LC circuits as well as the frequency response of each tuning section can be dynamically adjusted or tuned. The phase shifter in the second tuning section provides the ability to dynamically adjust the electrical delay through a portion of the circuit. Combining two of these three tuning section circuits will form a three port device, where a common port is formed at the junction of the two combined circuits, with the remaining two circuit ports designated a transmit port and a receive port.

In another embodiment of the invention a second phase shifter can be placed in series with the first phase shifter in the second tuning section of the previously described tunable band-pass circuit. This second phase shifter can be used in conjunction with the first phase shifter to increase the amount of electrical delay that can be added to the circuit path. A switch can be placed in parallel to the second phase shifter to provide the capability to by-pass the phase shifter. Combining two of these three tuning section circuits will form a three port device, where a common port is formed at the junction of the two combined circuits, with the remaining two circuit ports designated a transmit port and a receive port.

In another embodiment, a phase shifter can be connected between the second and third tuning sections of the previously described tunable band-pass circuit to provide the capability to alter the electrical delay between these tuning sections. Optimizing the electrical delay of this phase shifter can result in increased out-of-band rejection when two of these band-pass circuits are combined to form a duplexer.

In yet another embodiment, additional LC circuits, each containing a tunable capacitor, can be connected at the junctions of the inductor and capacitors of the parallel LC circuits. Proper component selection for the tunable capacitors and inductors can provide the capability to shift the frequency response of the band-pass response of the duplexer circuit.

In another embodiment, two tunable band-pass circuits as previously described are further combined to form a common port, a second port, and a third port. The second and third ports can be used to route transmit and receive signals between a transmitter, a receiver, and a common antenna or switch circuit or other component in a communication system. The combination of these two tunable band-pass circuits results in a tunable duplexer. This tunable duplexer provides the capability to alter the frequency response as well as bandwidth and transmission loss characteristics of one or both ports connected to the common port, resulting in improved performance for transceiver front-end applications.

In another embodiment, a tunable duplexer can be designed and implemented in a system to compensate for and/or improve the frequency response of the antenna used to transmit and receive RF signals. Optimizing the tunable duplexer to work with a specific antenna can result in improved out of band performance when the antenna is designed to have a sharper frequency roll-off.

In yet another embodiment, a tunable duplexer can be designed and implemented in a system to tune in conjunction with an active antenna system. The active antenna system can be configured to provide dynamic tuning of the frequency response of the antenna. By adjusting the frequency response and bandwidth characteristics of the active antenna system, the tunable duplexer can be tuned such that the combined frequency response, to include bandwidth and rate of roll-off in out-of-band frequency response, is improved compared to a tunable duplexer and passive antenna. Tuning an active antenna system in conjunction with a tunable duplexer provides the ability of relaxing the out-of-band roll-off required of the duplexer. This allows for the duplexer to be optimized to improve guard band frequency characteristics to include rate of roll-off. By implementing a tunable antenna and tunable duplexer combination, a look-up table can be implemented to tune both the duplexer and antenna per frequency channel.

Now turning to the drawings, FIG. 1 illustrates a tunable duplexer combined with an active antenna system to provide the capability to dynamically adjust the frequency response of the duplexer. An RF front-end module 11 contains a tunable duplexer 14 and one or more power amplifiers 12 and low noise amplifiers 13 coupled therewith. The tunable duplexer is connected to an active modal antenna 17 by way of a switch 15. The active modal antenna 17 is an active antenna wherein the impedance properties as well as the frequency response of the radiating element can be dynamically altered or tuned. The tunable components for the active modal antenna are contained within the Antenna Tuning Module (ATM) 16. A baseband processor 18 provides first control signals 19a for the tunable duplexer 14 and the ATM 16 as well as the switch 15. The ATM 16 provides second control signals 19b for configuring the active modal antenna 17. A Look-up Table (LUT) 100 is configured to contain tuning component control values 101 for the tunable components in the tunable duplexer 14, as well as component control values 102; 103 for components in the ATM 16.

Figure 2A:
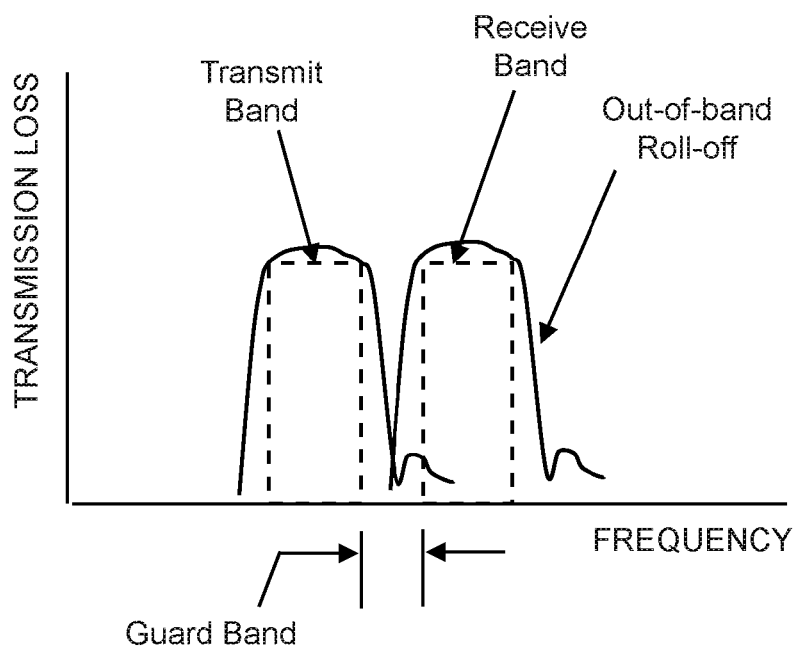
FIG. 2A illustrates a typical frequency response for a currently available non-tunable duplexer, wherein a transmit band and receive band are defined along with a guard band.

FIG. 2A illustrates a typical frequency response for a currently available non-tunable duplexer, wherein a transmit band and receive band are defined along with a guard band. The guard band is a set span in frequency to separate the transmit and receive bands. Out-of-band roll-off in the frequency response is shown. A minimum amount of rejection in out-of-band frequency components is typically defined for duplexers.

Figure 2B:
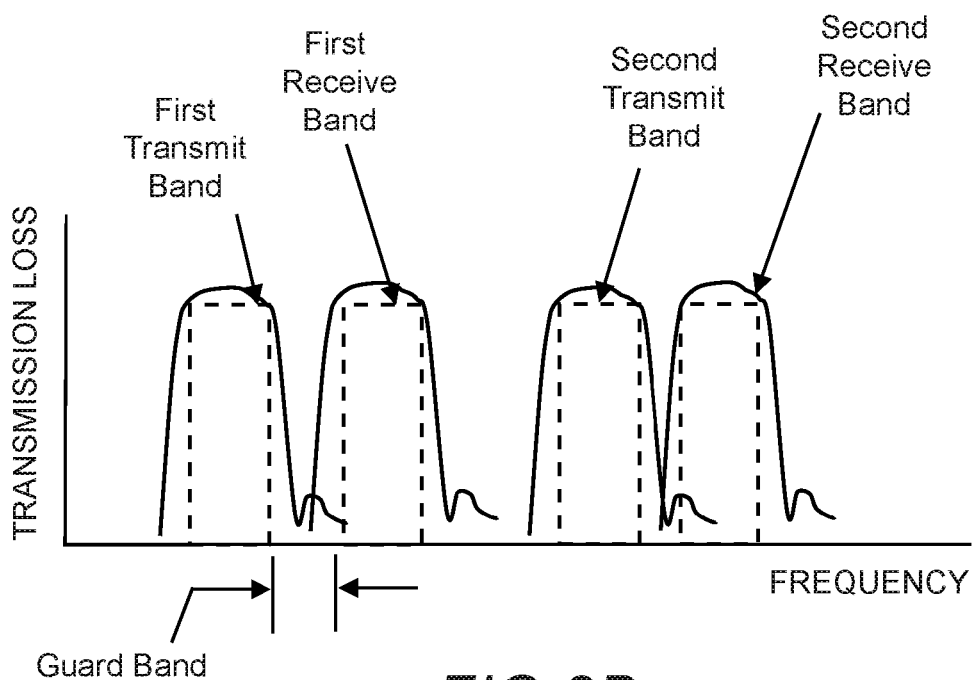
FIG. 2B illustrates a frequency response for a tunable duplexer in accordance with any of the embodiments herein, wherein the transmit band and receive bands as well as the guard bands can be dynamically adjusted.

FIG. 2B illustrates a frequency response for a tunable duplexer in accordance with any of the embodiments herein, wherein the transmit band and receive bands as well as the guard bands can be dynamically adjusted. First transmit band and first receive band are shown with a specific guard band. Also shown is the frequency response of second transmit band and second receive band, wherein the guard band between transmit and receive has been reduced compared to the first transmit band and first receive band pairing.

Figure 3:
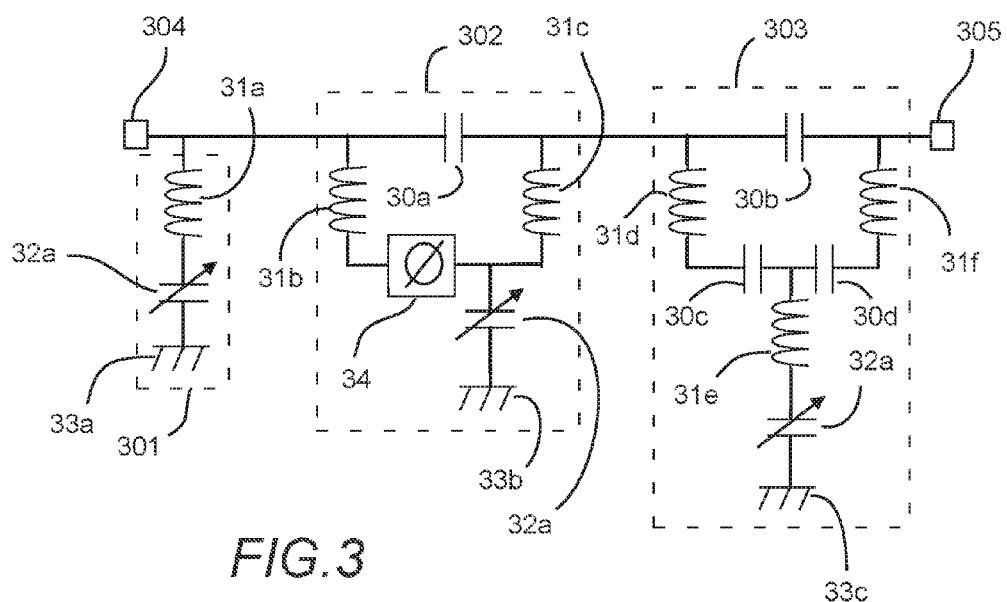
FIG. 3 illustrates a tunable band-pass circuit which contains three tuning sections in accordance with one embodiment.

FIG. 3 illustrates a tunable band-pass circuit which contains three tuning sections. Each tuning section contains a tunable capacitor along with fixed inductors, capacitors, or both. The tunable capacitor integrated into each tuning section provides the capability to dynamically alter the frequency response of the reactive circuit. The first tuning section 301 is a series LC circuit containing a single inductor 31a and a tunable capacitor 32a, one end of the tunable capacitor 32a is connected to ground 33a. The second tuning section 302 contains a pair of inductors 31b; 31c positioned in a shunt configuration, with a fixed capacitor 30a used to separate one node of each inductor. A tunable capacitor 32a is connected at the junction of the second pair of nodes for the two inductors 31b; 31c. The phase shifter 34 is positioned between one of the inductors 31b and the tunable capacitor 32a. The third tuning section 303 contains a pair of series LC circuits positioned in a shunt configuration, with a fixed capacitor 30b used to separate one node of each LC circuit. The pair of series LC circuits includes: a first LC circuit having an inductor 31d in series with a capacitor 30c; and a second LC circuit having an inductor 31f in series with a capacitor 30d. A series LC circuit containing a third inductor 31e and a tunable capacitor 32a is connected at the junction of the second pair of nodes for the two series LC circuits in shunt configuration, as shown. The tunable capacitor in all three tuning sections has one node connected to ground (33a; 33b; 33c), with all three tuning sections connected to form a two port circuit with a first port 304 and a second port 305.

Figure 4:
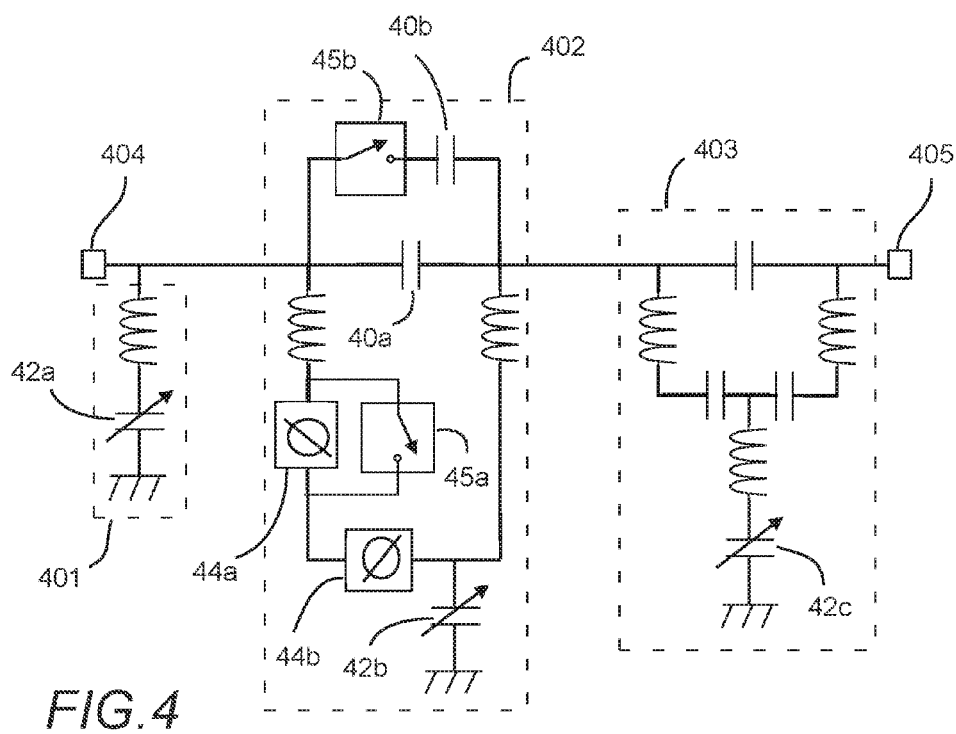
FIG. 4 illustrates a modified tunable band-pass circuit in accordance with another embodiment.

FIG. 4 illustrates the tunable band-pass circuit described in FIG. 3 with modifications to the second tuning section 402. A switch 45a has been connected in shunt to the phase shifter 44a to provide the capability of by-passing the phase shifter. A second phase shifter 44b has been connected to the first phase shifter and the tunable capacitor 42b. A second switch 45b and additional fixed capacitor 40b in series configuration has been connected in shunt to the fixed capacitor 40a used to separate the two shunt inductors. The first tuning section 401 contains an inductor 31a coupled to a tunable capacitor 32a, with one end of the tunable capacitor being further coupled to ground 33a. and the third tuning section remains as similar to that of FIG. 3, the third tuning section 403 contains a pair of series LC circuits positioned in a shunt configuration, with a fixed capacitor used to separate one node of each LC circuit. The pair of series LC circuits includes: a first LC circuit having an inductor in series with a capacitor; and a second LC circuit having an inductor in series with a capacitor. A series LC circuit containing a third inductor and a tunable capacitor 42c is connected at the junction of the second pair of nodes for the two series LC circuits in shunt configuration, as shown.

Figure 5:
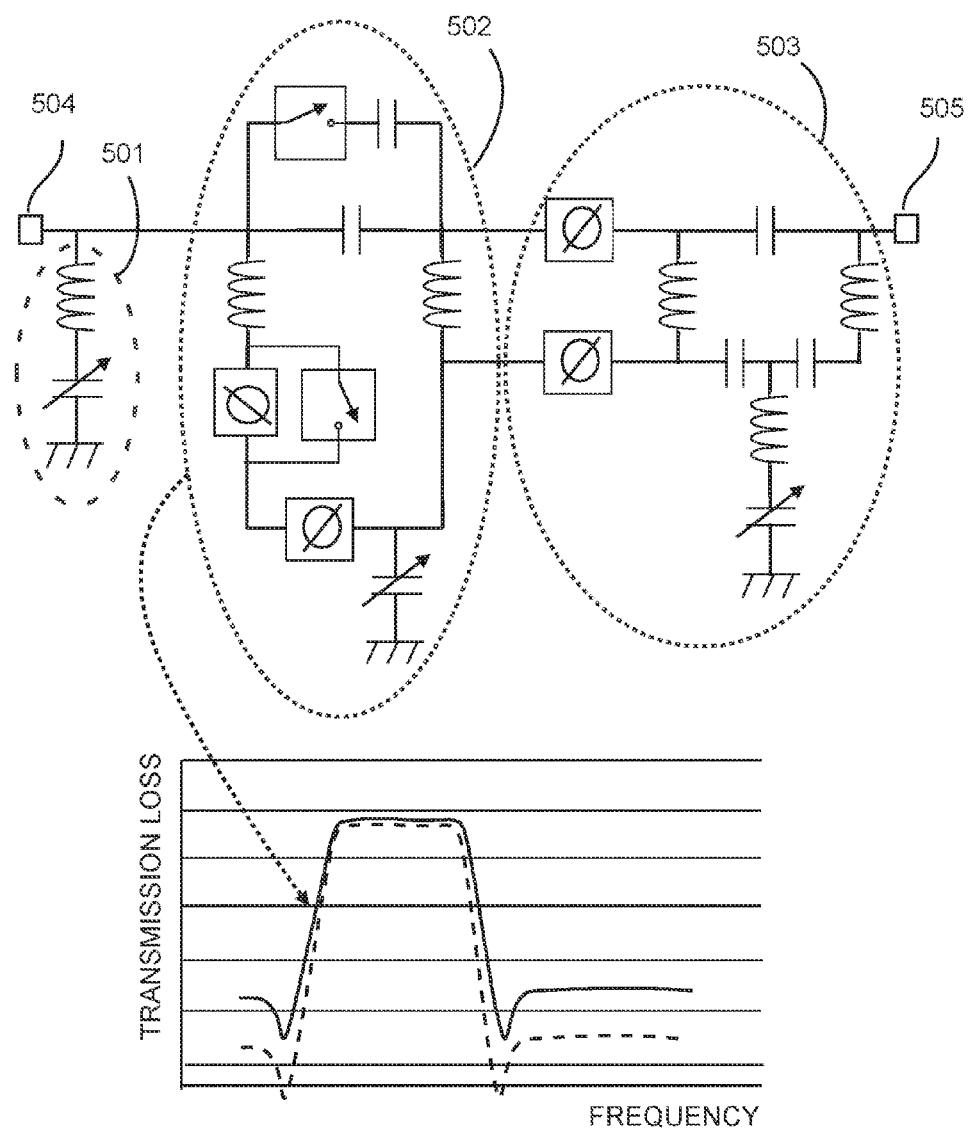
FIG. 5 illustrates a modified tunable band-pass circuit in accordance with another embodiment.

FIG. 5 illustrates the tunable band-pass circuit described in FIG. 4 with a modification in the method of connecting the second tuning section 502 to the third tuning section 503. Instead of a direct connection between tuning sections 502 and 503, a phase shifter is used to connect the two tuning sections. An additional phase shifter is connected at a node of an inductor in the second tuning section 502 and at the node of an inductor in the third tuning section 503. The tunable band pass circuit includes a first port 504 and a second port 505. The first tuning section 501 is substantially as described in previous embodiments. Here, the phase shifters are adjusted to improve roll-off and bandwidth as shown in the illustrated representation.

Figure 6:
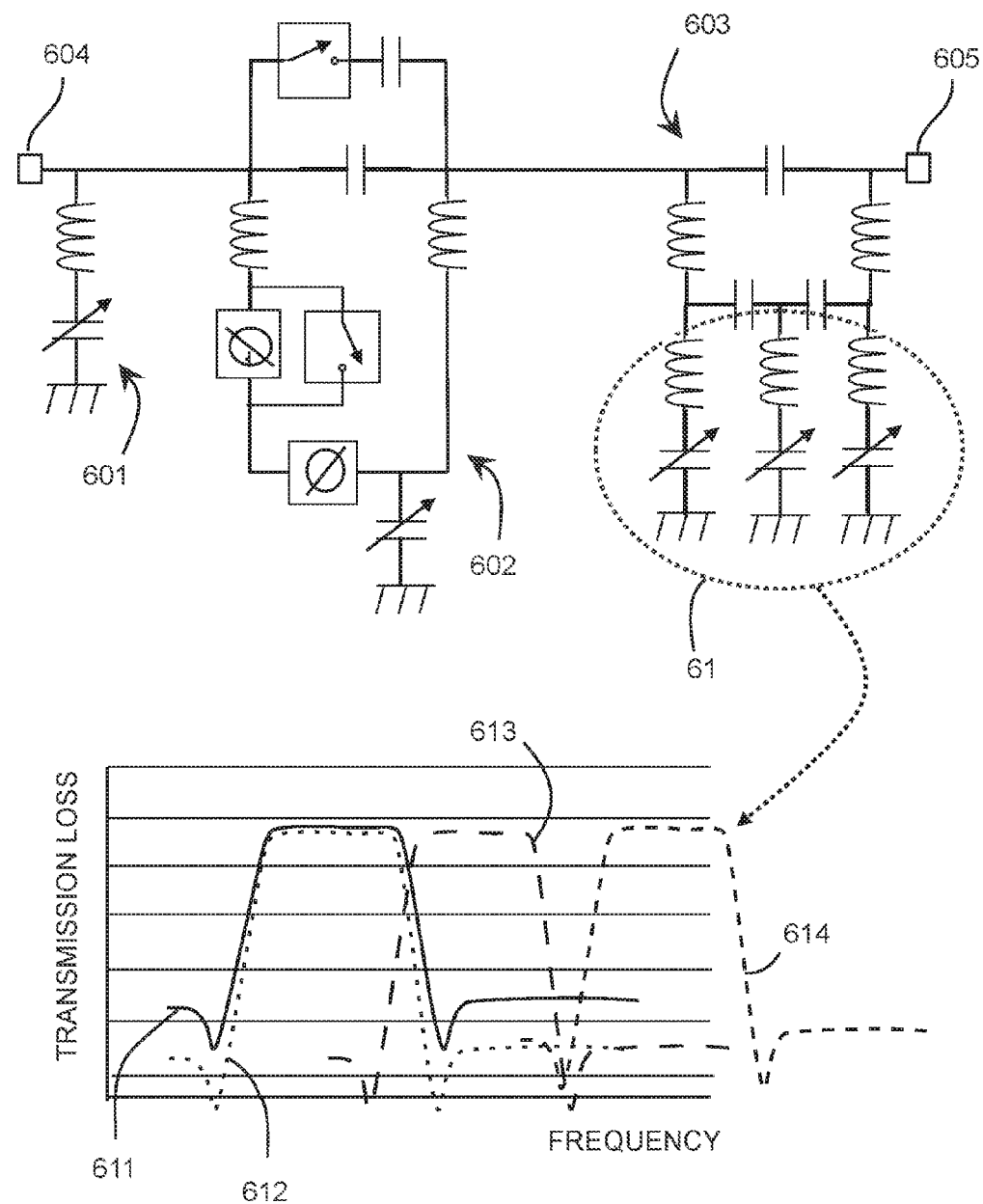
FIG. 6 illustrates a modified tunable band-pass circuit in accordance with yet another embodiment.

FIG. 6 illustrates the tunable band-pass circuit described in FIG. 4 with modifications to the third tuning section 603. A first, second and third series LC circuit, each containing a tunable capacitor, collectively shown as 61, is connected to nodes in the tuning section and ground. The second LC tunable circuit is connected at the junction of the first series LC circuit, connected at the node between the inductor and capacitor. The third LC tunable circuit is connected at the junction of second fixed series LC circuit, connected at the node between the inductor and capacitor. This results in three series tunable LC circuits in the third tuning section to provide additional tuning capability and increased tunable frequency range as shown in the appended plot representation, with four modes including a first mode 611, second mode 612, third mode 613, and fourth mode 614.

Figure 7:
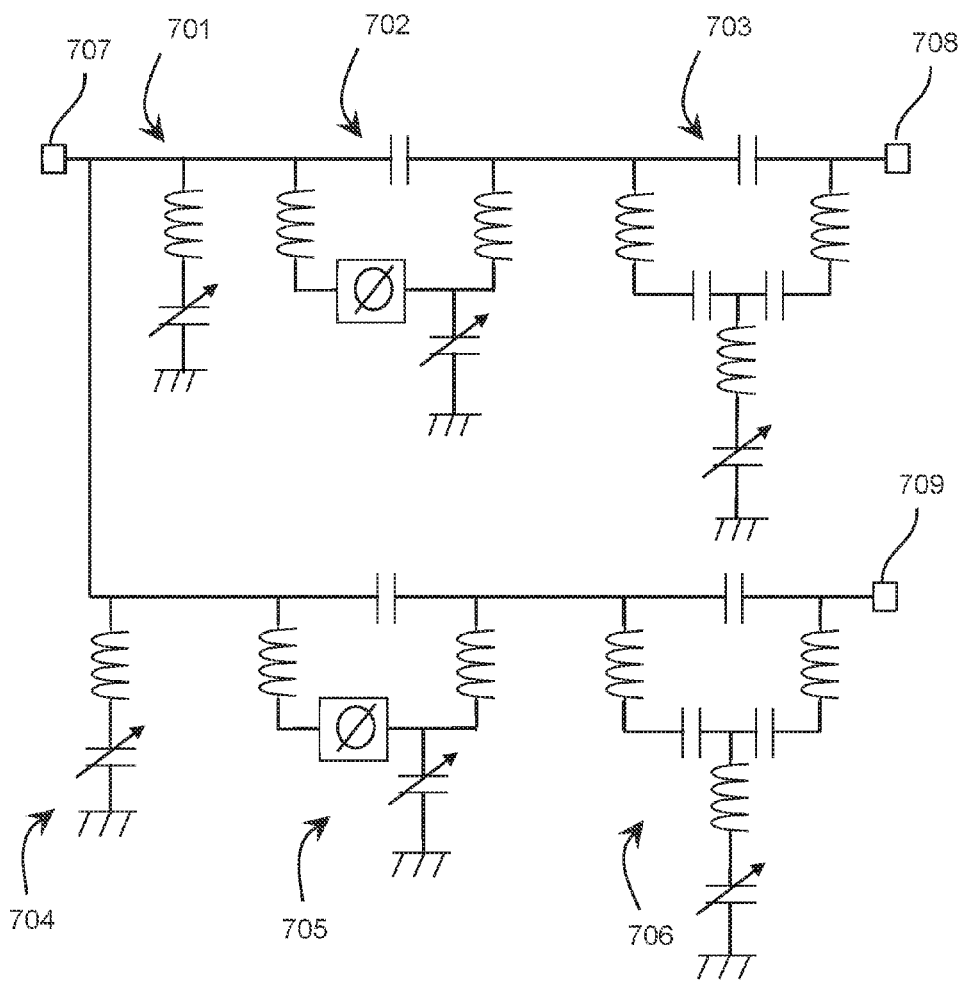
FIG. 7 illustrates a tunable duplexer wherein two tunable band-pass circuits are combined.

FIG. 7 illustrates a tunable duplexer wherein two tunable band-pass circuits as described in FIG. 3 are connected at a common junction to form a three port circuit. A common port 707 is defined as the junction of the two tunable band-pass circuits, with a transmit port 708 and receive port 709 defined at the other end of the two tunable band-pass circuits. Six distinct tuning sections of the tunable duplexer 701-706, are shown.

Figure 8:
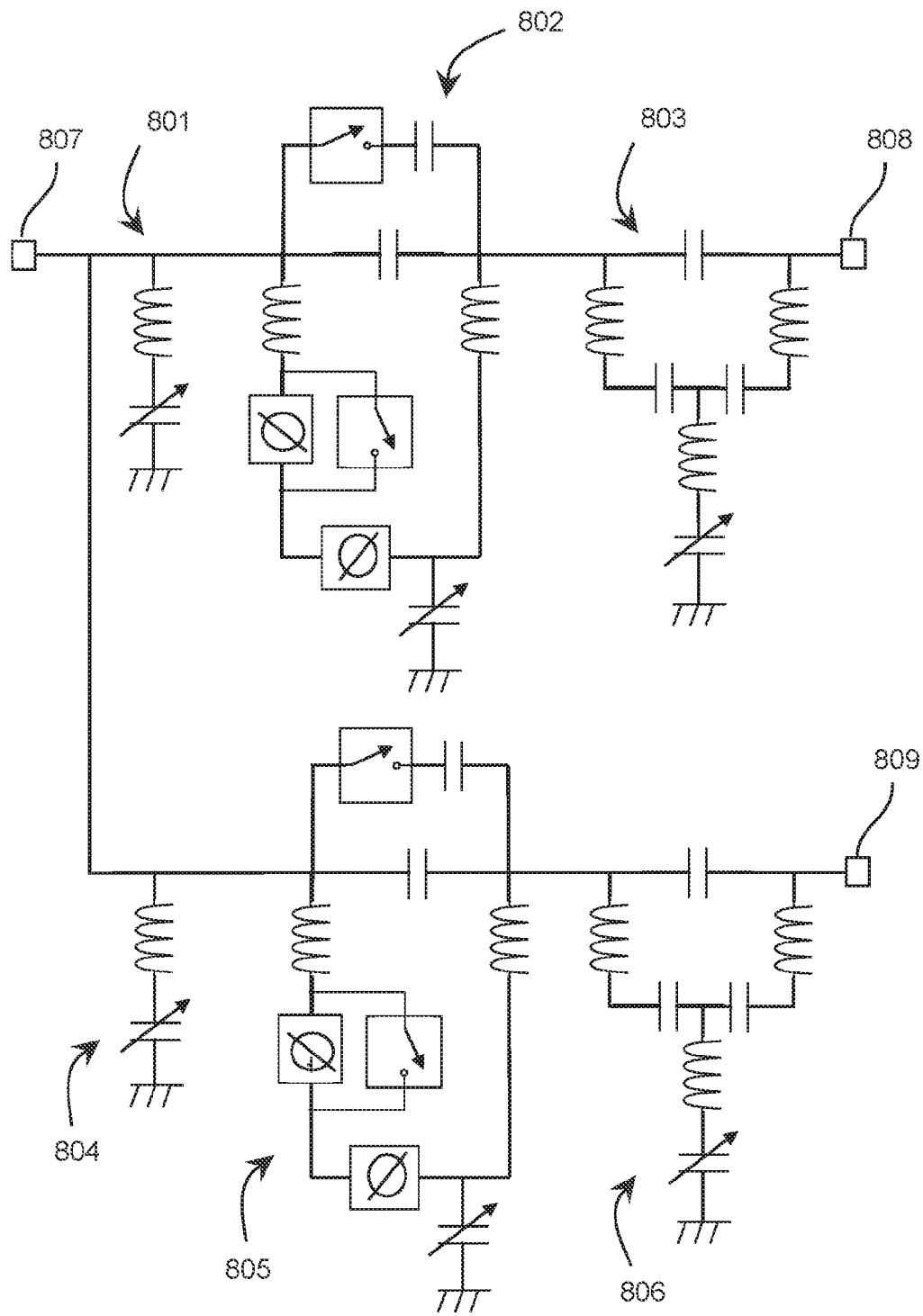
FIG. 8 illustrates a tunable duplexer in accordance with another embodiment.

FIG. 8 illustrates a tunable duplexer wherein two tunable band-pass circuits as described in FIG. 4 are connected at a common junction to form a three port circuit. A common port 807 is defined as the junction of the two tunable band-pass circuits, with a transmit port 808 and receive port 809 defined at the other end of the two tunable band-pass circuits. Six distinct tuning sections of the tunable duplexer 801-806, are shown.

Figure 9:
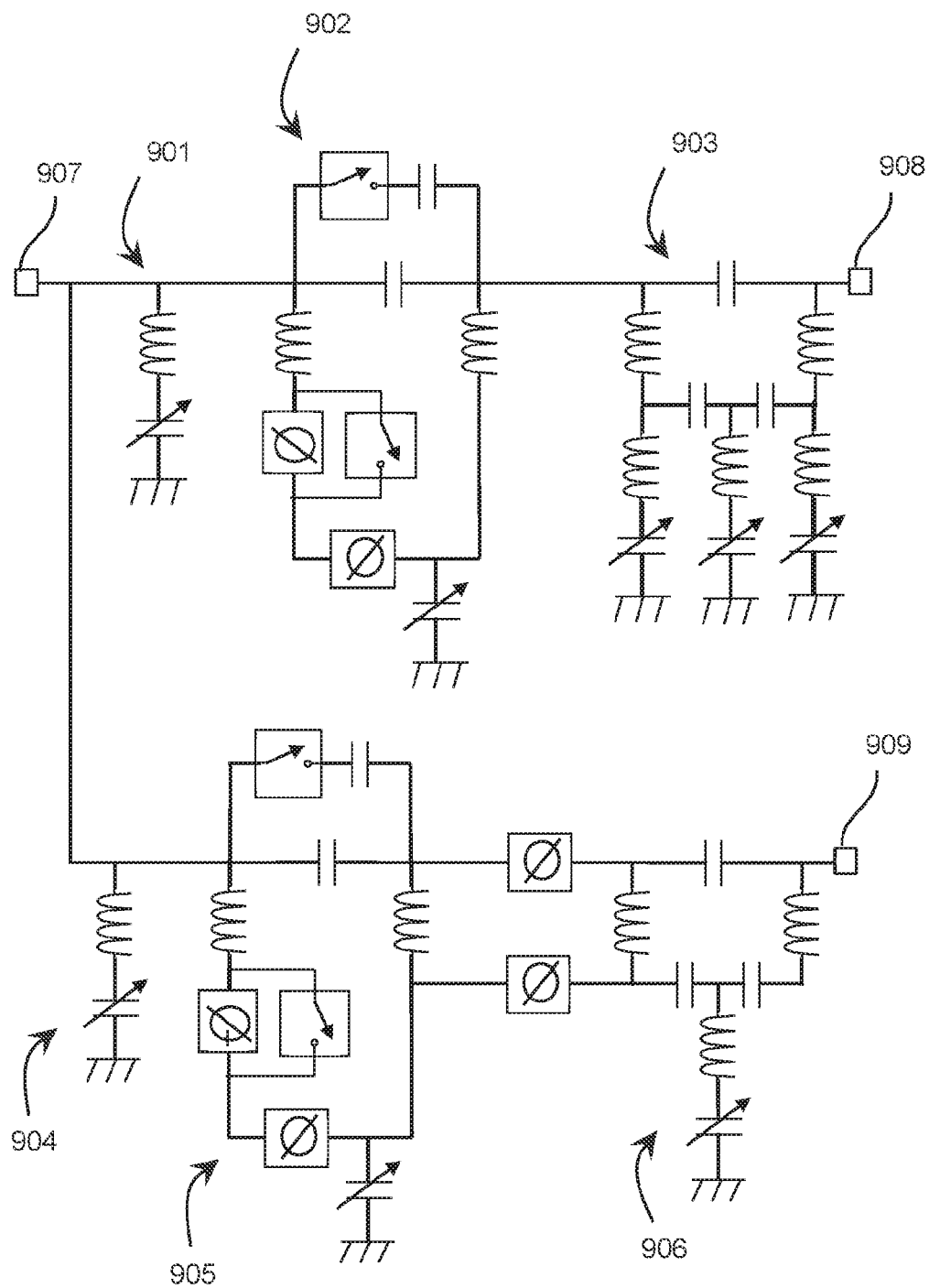
FIG. 9 illustrates a tunable duplexer in accordance with yet another embodiment.

FIG. 9 illustrates a tunable duplexer wherein the tunable band-pass circuit described in FIG. 5 is combined with the tunable band-pass circuit described in FIG. 6 to form a three port circuit. A common port 907 is defined as the junction of the two tunable band-pass circuits, with a transmit port 908 and receive port 909 defined at the other end of the two tunable band-pass circuits. Six distinct tuning sections of the tunable duplexer 901-906, are shown.

Figure 10:
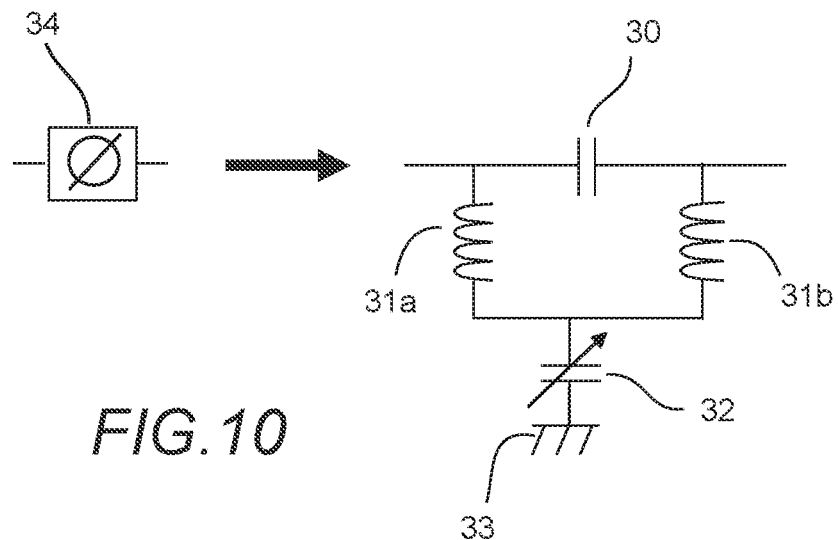
FIG. 10 illustrates a circuit that can be used to form a phase shifter in certain embodiments herein.

FIG. 10 illustrates a circuit that can be used to form a phase shifter in certain embodiments herein. Two inductors 31*a*; 31*b* are configured in a shunt configuration, with a fixed capacitor 30 used to separate two nodes of the inductors. A tunable capacitor 32 is connected at the junction of the two inductors, with one node of the tunable capacitor connected to ground 33.

Figure 11:
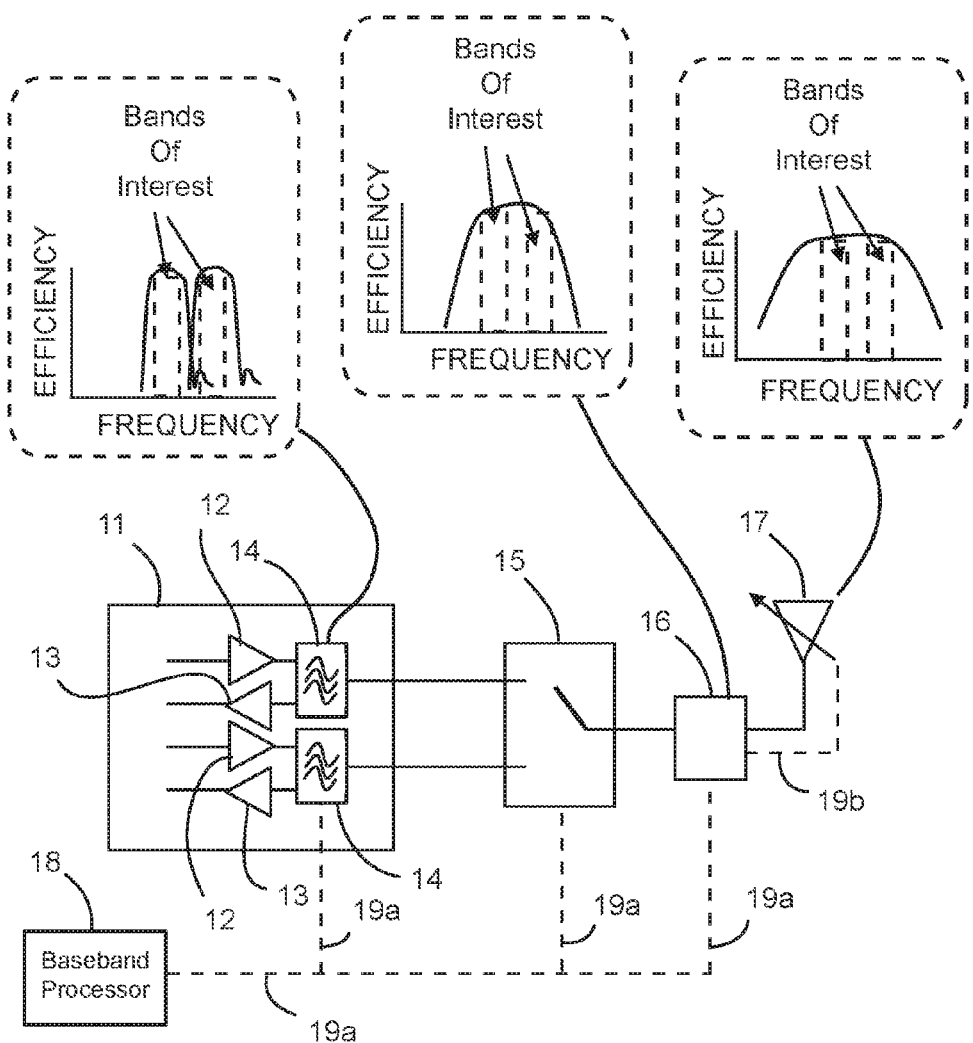
FIG. 11 illustrates a tunable duplexer combined with an active antenna system.

FIG. 11 illustrates a tunable duplexer combined with an active antenna system in a manner similar to that of FIG. 1. An RF front-end module 11 is shown which contains a tunable duplexer 14. The tunable duplexer is connected to the active antenna 17 by way of a switch 15. The active antenna consists of a radiator and antenna tuning module (ATM) 16. Tunable components are contained in the ATM to dynamically adjust the impedance properties as well as the frequency response of the radiating element. A baseband processor 18 provides control signals 19*a* for the tunable duplexer and the ATM as well as the switch. A Look-up Table (LUT) is configured to contain tuning component control values for the tunable components in the tunable duplexer as well as the ATM. The tunable duplexer and the ATM are tuned in conjunction to optimize the frequency response of the duplexer.

What is claimed is:

1. A tunable band-pass circuit comprising:
   a first tuning section comprising:
      a first inductor in series with a first tunable capacitor, the first tunable capacitor being further connected to ground;
   a second tuning section comprising:
      a second inductor, a first phase shifter, and a second tunable capacitor in a series configuration, with the second tunable capacitor being further connected to ground;
      a third inductor connected in parallel across the second inductor and first phase shifter;
      a first fixed capacitor positioned between the second inductor and the third inductor; and
   a third tuning section comprising
      a fourth inductor and a second fixed capacitor in a series configuration forming a first series LC circuit;
      a fifth inductor and a third fixed capacitor in a series configuration forming a second series LC circuit;
      a sixth inductor in series with a third tunable capacitor forming a third series LC circuit, a first terminal end of the third series LC circuit connected to a common junction of the first and second series LC circuits, and a second terminal end of the third series LC circuit being connected to ground;
      a fourth fixed capacitor positioned between the first series LC circuit and the second series LC circuit;
   the first, second, and third tuning sections being connected in series between a first port and a second port to form a band-pass frequency response;
   wherein each of the first through third tunable capacitors is configured for variable tuning for changing the frequency response of the circuit.

2. The tunable band pass circuit of claim 1, wherein at least one of the first through sixth inductors comprises a tunable inductor.

3. A tunable duplexer, said tunable duplexer comprising:
   a first tunable band-pass circuit, the first tunable band-pass circuit comprising:
      a first tuning section comprising:
         a first inductor in series with a first tunable capacitor, the first tunable capacitor being further connected to ground;
      a second tuning section comprising:
         a second inductor, a first phase shifter, and a second tunable capacitor in a series configuration, with the second tunable capacitor being further connected to ground;
         a third inductor connected in parallel across the second inductor and first phase shifter;
         a first fixed capacitor positioned between the second inductor and the third inductor; and
      a third tuning section comprising
         a fourth inductor and a second fixed capacitor in a series configuration forming a first series LC circuit;
         a fifth inductor and a third fixed capacitor in a series configuration forming a second series LC circuit;
         a sixth inductor in series with a third tunable capacitor forming a third series LC circuit, a first terminal end of the third series LC circuit connected to a common junction of the first and second series LC circuits, and a second terminal end of the third series LC circuit being connected to ground;
         a fourth fixed capacitor positioned between the first series LC circuit and the second series LC circuit;
      the first, second, and third tuning sections being connected in series between a first port and a second port to form a band-pass frequency response;
   a second tunable band-pass circuit; and
   memory comprising a lookup table, said lookup table containing data for configuring one or more or the tunable capacitors of the tunable duplexer;
   said first and second tunable band-pass circuits coupled at a common input port.

4. The tunable duplexer of claim 3, wherein the first tunable band-pass circuit further comprises a transmit port formed at an end opposite the common input port.

5. The tunable duplexer of claim 3, wherein the second tunable band-pass circuit further comprises a receive port formed at an end opposite the common input port.

6. The tunable duplexer of claim 3, combined with a second tunable duplexer and a third tunable duplexer; wherein the input ports of the first and second tunable duplexers are each connected to a first and second output port of the third tunable duplexer to form a tunable quadplexer.

7. The tunable duplexer of claim 3, wherein each of the first through third tunable capacitors is configured for variable tuning for changing the frequency response of the circuit.

8. The tunable duplexer of claim 3, wherein the second tuning section further comprises: a second phase shifter in series with the second inductor, the first phase shifter, and the second tunable capacitor.

9. The tunable duplexer of claim 8, further comprising a first switch connected in parallel to the first phase shifter.

10. The tunable duplexer of claim 9, wherein the third inductor is connected in parallel across the second inductor and first and second phase shifters.

* * * * *